US011047733B2

(12) United States Patent
Ranganathan et al.

(10) Patent No.: US 11,047,733 B2
(45) Date of Patent: Jun. 29, 2021

(54) LIGHT-TO-FREQUENCY CONVERTER ARRANGEMENT AND METHOD FOR LIGHT-TO-FREQUENCY CONVERSION

(71) Applicant: ams International AG, Rapperswil (CH)

(72) Inventors: Rohit Ranganathan, Telangana (IN); Ravi Kumar Adusumalli, Telangana (IN)

(73) Assignee: AMS INTERNATIONAL AG, Rapperswil (CH)

( * ) Notice: Subject to any disclaimer, the term of this patent is extended or adjusted under 35 U.S.C. 154(b) by 119 days.

(21) Appl. No.: 16/489,256

(22) PCT Filed: Mar. 1, 2018

(86) PCT No.: PCT/EP2018/055078
§ 371 (c)(1),
(2) Date: Aug. 27, 2019

(87) PCT Pub. No.: WO2018/158384
PCT Pub. Date: Sep. 7, 2018

(65) Prior Publication Data
US 2020/0003616 A1    Jan. 2, 2020

(30) Foreign Application Priority Data

Mar. 1, 2017  (EP) .................................... 17158716

(51) Int. Cl.
*G01J 1/44* (2006.01)
*H03M 1/60* (2006.01)
(52) U.S. Cl.
CPC .................. *G01J 1/44* (2013.01); *H03M 1/60* (2013.01); *G01J 2001/446* (2013.01)
(58) Field of Classification Search
CPC ........ G01J 1/44; G01J 2001/446; H03M 1/60; H03M 1/145; H04N 5/37455
See application file for complete search history.

(56) References Cited

U.S. PATENT DOCUMENTS

| 2014/0293272 A1 | 10/2014 | Xu | |
| 2015/0194973 A1* | 7/2015 | Furuta | G04F 10/005 348/308 |
| 2015/0326805 A1* | 11/2015 | Scott | H04N 5/378 348/243 |

FOREIGN PATENT DOCUMENTS

| EP | 2863192 | 4/2015 |
| WO | 2013/127450 | 9/2013 |

OTHER PUBLICATIONS

European Patent Office, International Search Report for PCT/EP2018/055078, dated May 11, 2018.

* cited by examiner

*Primary Examiner* — Thanh Luu
*Assistant Examiner* — Monica T Taba
(74) *Attorney, Agent, or Firm* — MH2 Technology Law Group LLP (57) ABSTRACT

A method for light-to-frequency conversion comprises generating a photocurrent by means of a photodiode and converting the photocurrent into a digital comparator output signal in a charge balancing operation depending on a first clock signal. From the digital comparator output signal an asynchronous count is determined and comprises an integer number of counts depending on the first clock signal. From the digital comparator output signal a fractional time count is determined and depends on a second clock signal. Finally, from the asynchronous count and from the fractional time count a digital output signal is calculated which is indicative of the photocurrent generated by the photodiode. The method may be carried out by an exemplary light-to-frequency converter equipped with a photodiode.

17 Claims, 4 Drawing Sheets

LIGHT-TO-FREQUENCY CONVERTER ARRANGEMENT AND METHOD FOR LIGHT-TO-FREQUENCY CONVERSION

This invention relates to a light-to-frequency converter arrangement and to a method for Light-to-frequency conversion.

BACKGROUND OF THE INVENTION

Optical sensors such as ambient light sensors find increasing application in mobile devices such as Smartphones, tablets or in various electronic equipment related to television or room lighting. Under normal light conditions the optical sensors and their dedicated signal processing circuits have reached a state of development that allows for an accurate measure of lighting conditions or even colors of lighting under changing lighting. However, in low light conditions light-to-frequency conversion embedded in optical sensor arrangement often fails to give an accurate estimate of the incident light. Typically, only few counts are detected and losing a few counts can manifest in a larger error than under bright light conditions.

It is to be understood that any feature described hereinafter in relation to any one embodiment may be used alone, or in combination with other features described hereinafter, and may also be used in combination with one or more features of any other of the embodiments, or any combination of any other of the embodiments, unless explicitly described as an alternative. Furthermore, equivalents and modifications not described below may also be employed without departing from the scope of the light-to-frequency converter arrangement and the method for light-to-frequency conversion as defined in the accompanying claims.

SUMMARY OF THE INVENTION

In at least one embodiment a method for light to frequency conversion comprises the following steps. The method may be carried out by an exemplary light-to-frequency converter equipped with a photodiode discussed in further detail below.

First, a photocurrent is generated by means of a photodiode. The photocurrent is converted into a digital comparator output signal in a charge balancing operation depending on a first clock signal. An asynchronous count is determined from the digital comparator output signal. The asynchronous count comprises an integer number of counts depending on the first clock signal. Additionally, a fractional time count is determined from the digital comparator output signal depending on a second clock signal. Finally, a digital output signal is calculated from the asynchronous count and from the fractional time count which is indicative of the photocurrent generated by the photodiode.

In at least one embodiment the photocurrent is integrated into one or more reference charge packages for the duration of an integration time. The detection of a charge package determines an integration cycle. For example, charge is accumulated from starting condition to an end condition. The charge accumulated in the process can be considered a charge package. The first clock signal is used to count a number of reference charge packages during the integration time. The asynchronous count is determined from the number of charge packages counted in terms of the first clock signal.

In at least one embodiment an integration cycle is determined from the time count by measuring adjacent counts in the asynchronous count in terms of the second clock signal. For example, the counts are measured in time periods and the time count is an indication of said time periods.

In at least one embodiment the time count is reset when a count has been determined.

In at least one embodiment a time period of a first integration cycle is determined as first integration period. The first integration period is determined by a first time stamp indicating the start of the first integration cycle and the second time stamp indicating a time of the first count in the asynchronous count.

In at least one embodiment the time period of one or more complete integration periods is determined as complete integration period. For example, a complete integration period can be considered any time period between two adjacent counts in the asynchronous count. The complete integration period is determined by a third time stamp indicating a count in the asynchronous count and a fourth time stamp indicating an adjacent count in the asynchronous count.

In at least one embodiment more than a single complete integration period is determined. An average complete integration period is determined from the determined complete integration periods.

In at least one embodiment a time period between the last complete integration cycle and an end of the integration is determined as residual time period. The residual integration period is determined by a stamp indicating the last count in the asynchronous count and a stamp indicating the end of the integration, i.e. when signal acquisition is terminated as the integration time has run through.

In at least one embodiment a first count error is accounted for by calculating a first fractional count. The first fractional count is based on the first integration period and the complete integration period. The first fractional count is a measure of the photocurrent generated during the first integration cycle.

In at least one embodiment a residual count error is accounted for by calculating a second fractional count. The second fractional count is based on the last integration period, the complete integration period and the residual time period. The complete integration period can be any period indicating the time of a complete integration cycle. For example, the complete integration period refers to the period of the last complete integration cycle. The second fractional count is a measure of the photocurrent generated during the last integration cycle.

In at least one embodiment the digital comparator output signal is generated by means of a latched the comparator. A comparator latch synchronization error is accounted for by calculating an average integration period of more than a single complete integration period. The average integration period is a measure of a modulation in the digital comparator output signal introduced by the latched comparator.

In at least one embodiment the average integration period is used instead of a single complete integration period, e.g. the last complete integration period. The average integration period is used for correcting the first count error, residual count error, and/or comparator latch synchronization error.

In at least one embodiment the digital output signal includes a sum based on the asynchronous count and the first and second fractional counts, based on one or more complete integration periods and/or the average integration period.

In at least one embodiment the light-to-frequency converter arrangement comprises an analog-to-digital converter arrangement, and a signal processing unit. The analog-to-digital converter arrangement comprises a sensor input for connecting a photodiode and a result output for providing a digital comparator output signal. The signal processing unit is connected to the result output of the analog-to-digital converter.

During operation the analog-to-digital converter performs a charge balancing operation depending on a first clock signal. The analog-to-digital converter is adapted to convert a photocurrent generated by the photodiode into the digital comparator output signal. The signal processing unit is adapted to determine from the digital comparator output signal a digital output signal comprising an asynchronous count and a fractional time count. The asynchronous count comprises an integer number of counts depending on the first clock signal. The fractional time count depends on a second clock signal. The digital output signal is indicative of the photocurrent generated by the photodiode.

In at least one embodiment the signal processing unit comprises a first counter, a second counter, and a logic/calculation engine. The first counter has a first clock input connected to the result output and comprising a first reset input. The second counter comprises a second clock input and the second reset input. The logic/calculation engine comprises a calculation input connected to a first counter output of the first counter and to a second counter output of the second counter, respectively.

During operation the first counter receives the first clock signal at the first clock input and generates the asynchronous counts depending on the first clock signal. The second counter receives the second clock signal at the second clock input and generates the time count depending on the second clock signal. Finally, the logic/calculation engine receives the asynchronous count and the time count recalculates the digital output signal from the asynchronous count and the time count.

In at least one embodiment the analog to digital converter arrangement comprises a latched comparator providing the digital comparator output signal. Furthermore, the signal processing unit is adapted to determine an average integration period to correct for a modulation in the digital comparator output signal.

The improved concept is based on the idea that several sources of error in our light to frequency conversion can be accounted for by calculating error estimates from fractional counts. The proposed method and architecture can resolve and measure accurately the residual signal of the last integration cycle of the analog-to-digital converter. This way an accurate measurement can be achieved even from low counts of the converter. The digital output signal can be scaled with a multiplier without significant loss of accuracy for a wide range.

The residue count error and the first count error can be measured and corrected by using the proposed method and architecture. Further sources of error can be corrected such as the error arising from a comparator-latch synchronisation error. Very low photocurrents can be measured accurately from less counts (count <200) accurately and the dynamic range of operation can be extended up to six decades of operation with lower analog gains. In fact, a similar measurement accuracy than prior art solutions without fractional counts can be achieved due to the measurement strategy suggested in the improved concept but in less integration time. Hence, power can be saved data rate can be improved. Higher measurement accuracy in less integration time (Atime), can save power by using lower integration times also. The proposed method and architecture is largely immune to the modulation, e.g. due to 50 Hz/60 Hz supply, by using the average value to calculate the period for previous count (C2_P). For example, in order to correct for the impact of a 50/60 Hz modulation, the average count value can be calculated and the integration time should be a multiple of the 50/60 Hz period, e.g. 20 m/16.66 m. In general, any modulation frequency can be canceled by integrating one cycle or multiple cycles of the modulating frequency.

In the following, the concept presented above is described in further detail with respect to drawings, in which exemplary embodiments are presented.

In the exemplary embodiments and Figures below, similar or identical elements may each be provided with the same reference numerals. The elements illustrated in the drawings and their size relationships among one another, however, should not be regarded as true to scale. Rather individual elements, such as layers, components, and regions, may be exaggerated to enable better illustration or improved understanding.

DETAILED DESCRIPTION

Figure 1:
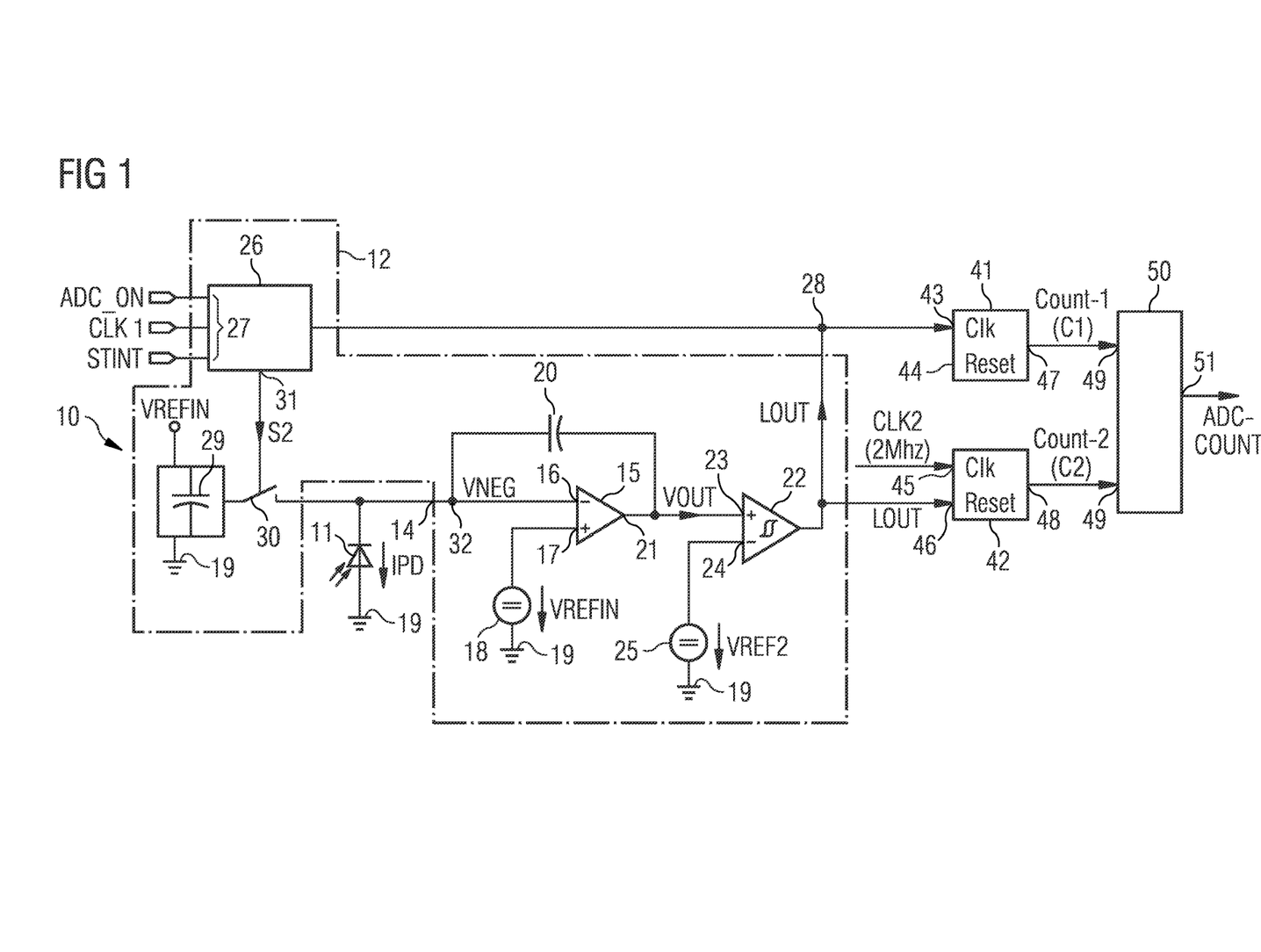
FIG. 1 shows an exemplary embodiment of an optical sensor arrangement.

FIG. 1 shows an exemplary embodiment of an optical sensor arrangement 10. The optical sensor arrangement 10 comprises a photodiode 11 and an analog-to-digital converter arrangement 12, abbreviated as converter hereinafter. Furthermore, the optical sensor arrangement 10 comprises a signal processing unit 40. The converter 12 and the signal processing unit 40 are combined into a light-to-frequency converter which may be designed as an integrated circuit.

Typically, the photodiode 11 is connected to the integrated circuit as an external component but may just as well be part of the integrated circuit in some embodiments. The light-to-frequency converter and photodiode can be considered an optical sensor arrangement hereinafter. In one or more embodiments the optical sensor arrangement is used an ambient light sensor. Similar circuits are described in EP 2863192 A1 and EP 2787331 A1 which are included by reference.

The photodiode 11 is connected to an input 14 of the converter 12. The converter 12 comprises an amplifier 15 having an amplifier input 16 connected to the input 14 of the converter 12. In this embodiment the amplifier input 16 is implemented as an inverting input. The amplifier 15 comprises a further amplifier input 17 that is designed as a non-inverting input, for example. The photodiode 11 connects the input 14 of the converter arrangement 12 to a reference potential terminal 19. A first bias source 18 couples the further amplifier input 17 to the reference potential terminal 19. An integrating capacitor 20 of the converter 12 connects the amplifier input 16 to an amplifier output 21 of the amplifier 15.

The converter 12 comprises a comparator 22 having a comparator input 23 which is connected to the amplifier output 21. The comparator input 23 is implemented as a non-inverting input, for example. A further comparator input 24 of the comparator 22 is designed as an inverting input, for example. A reference voltage source 25 connects the further comparator input 24 to the reference potential terminal 19. An output of the comparator 22 is connected to a digital control circuit 26. The digital control circuit 26 comprises a control input 27 and control logic as well as one or more clock generators.

Furthermore, the converter 12 comprises a reference capacitor 29. The reference capacitor 29 is coupled via a reference switch 30 of the converter arrangement 12 to the input 14 of the converter 12. Thus, the reference capacitor 29 is coupled to the amplifier input 16 by the reference switch 30. A control output 31 of the digital control circuit 26 is connected to a control terminal of the reference switch 30. The first bias source 18 is coupled to the reference capacitor 29.

The signal processing unit 40 is connected to a result output 28 of the converter 12. The signal processing unit 40 further comprises a first counter 41, a second counter 42 and a logic/calculation engine 50. The first counter 41 has a first clock input 43 which is connected to the result output 28. Furthermore, the first counter 41 has a first reset input 44. Similarly, the second counter 42 has a second clock input 45 and a second reset input 46. A first counter output 47 of the first counter 41 and a second counter output 48 of the second counter 42 are each connected to a calculation input 49 of the logic/calculation engine 50. Finally, the logic/calculation engine 50 comprises a calculation output 51. The signal processing unit 40 can, at least in parts, be implemented as a micro-controller.

Sensor signal acquisition is initialized by applying an input control signal ADC_ON and an integration time signal STINT to the control input 27 of the digital control circuit 26. Additionally, a first clock signal CLK1 can be provided to the control input 27. The first clock signal CLK1 can be provided by a clock generator (not shown) and/or be generated by the digital control circuit 26. For example, the optical sensor arrangement 10 is cleared before signal acquisition proceeds. As the input control signal ADC_ON is provided to the control input 27 operation of the converter 12 is triggered. The first bias source 18 provides the amplifier reference voltage VREFIN to the reference capacitor 29. The reference capacitor 29 generates a charge package QREF. The charge package QREF has a value according to $$Q_{ref} = V_{ref,in} \cdot C_{ref},$$

wherein $C_{ref}$ is a capacitance value of the reference capacitor 29 and $V_{ref,in}$ is a voltage value of the amplifier reference voltage. The digital control circuit 26 provides a reference switch signal S2 to the reference switch 30. After closing the reference switch 30, the charge package QREF is applied to the integration node 32. Furthermore, the first and second counters 41, 42 are reset by applying a reset signal SRESET to the first and second reset inputs 44, 46, respectively.

Depending on the input control signal ADC_ON, and after the optical sensor arrangement has been set or cleared to an initial condition, the photodiode 11 starts signal acquisition and generates a photo-current IPD. The value of the photocurrent depends on the intensity of the light incident on the photodiode 11. The photocurrent IPD flows through the photodiode 11 and the input 14 of the converter 12. The photodiode 11, the amplifier input 16 and the integrating capacitor 20 are each connected to an integration node 32. Also the reference capacitor 29 is coupled to the integration node 32 via the reference switch 30. The sensor current IPD flows from the integration node 32 to the reference potential terminal 19 with a positive value. An input voltage VNEG is tapped at the amplifier input 16 and, thus, also at the integration node 32. The first bias source 18 provides an amplifier reference voltage VREFIN to the further amplifier input 17. The amplifier 15 generates an output voltage VOUT at the amplifier output 21.

In the case the reference switch 30 is open, the photocurrent IPD is integrated on the integrating capacitor 20. The output voltage VOUT rises with time t as $$V_{OUT} = I_{PD} \cdot t \cdot C_{INT},$$

wherein $I_{RD}$ is a value of the photocurrent and $C_{INT}$ denotes a capacitance value of the integrating capacitor 20.

The output voltage VOUT of the amplifier 15 is applied to the comparator input 23. The reference voltage source 25 generates a bias voltage VREF2 which then is applied as a comparator reference voltage VREFC to the further comparator input 24. The comparator 22 generates a comparator output signal LOUT depending on the values of the output signal VOUT and of the comparator reference voltage VREFC. The comparator output signal LOUT has a first logical value if the output voltage VOUT is larger than the comparator reference voltage VREFC and has a second logical value if the output voltage VOUT is smaller than the comparator reference voltage VREFC. The comparator output signal LOUT is provided to the digital control circuit 26.

During signal acquisition the signal processing unit 40 counts the pulses of the comparator output signal LOUT. Basically, the counting is done by the first counter 41. Together the converter 12 and the first counter 41 can be considered a first order modulator that generates an asynchronous count COUNT-1, or abbreviated as C1 hereinafter. The asynchronous count C1 is directly proportional to the photocurrent IPD is integrated on the integrating capacitor 20. However, this is only true within an error margin. As will be discussed in more detail with respect to FIG. 2 the asynchronous count C1 is prone to error which is accounted for by the signal processing engine 40. The first counter 41 provides the asynchronous count C1. This count, however, only comprises an integer number of individual counts.

The second counter 42 can be considered a free running counter operating on a second clock signal CLK2 received at the second clock input 45. The second clock signal CLK2 can be provided by a clock generator (not shown) and/or by the digital control circuit 26. The second counter 42 is reset by receiving the comparator output signal LOUT at the second reset input 46. The second counter 42 generates a time count COUNT-2, or abbreviated as C2 hereinafter, that resolves a time period between adjacent periods or time intervals of the asynchronous count C1. For example, the second clock signal CLK2 is implemented with a higher frequency when compared with the first clock signal CLK2. For example, the first clock signal CLK1 has a rectangular function with a frequency of 737 kHz and the second clock signal CLK2 has a rectangular function with a frequency of 2 MHz.

Figure 2:
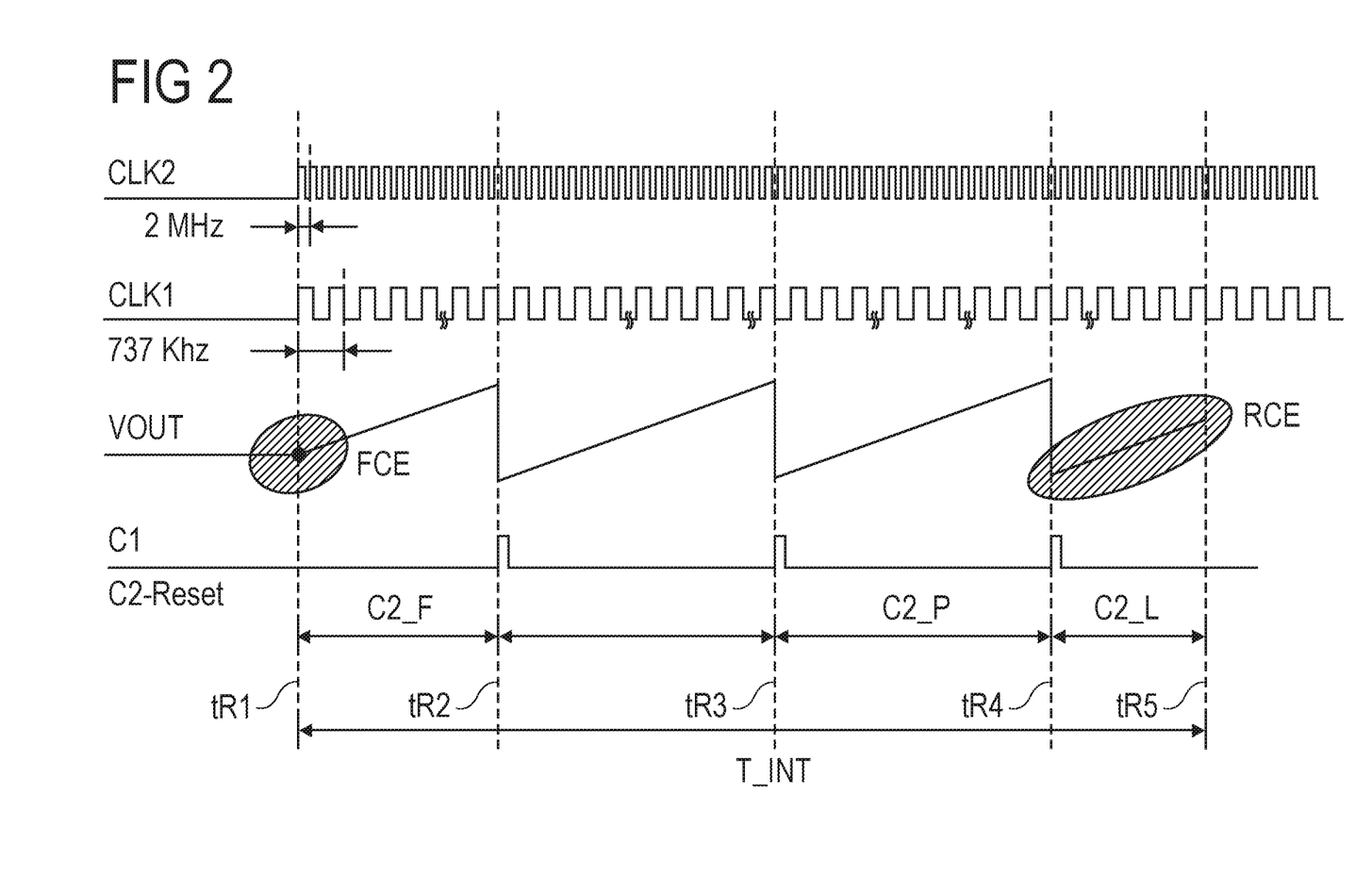
FIG. 2 shows an exemplary timing diagram of signals of the exemplary embodiment of an optical sensor arrangement
Figure 4:
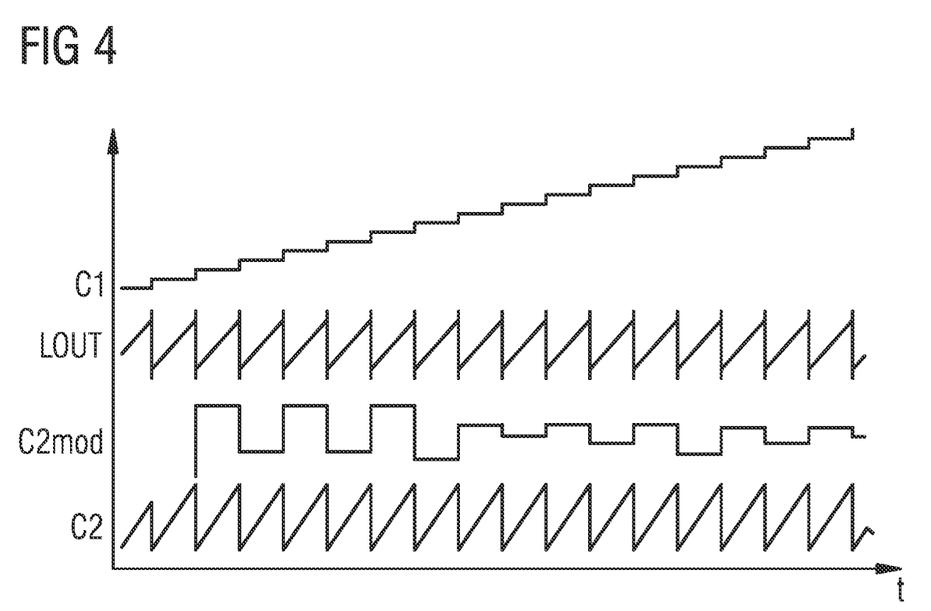
FIG. 4 shows another exemplary timing diagram of signals.

The logic/calculation engine 50 receives both the asynchronous count C1 and the time count C2 at the calculation input 49. The logic/calculation engine 50 uses both these counts C1 and C2 to generate a fractional count C-ERROR, abbreviated CE hereinafter, that can be used to account for various errors. Further details will be discussed below with respect to FIGS. 2 and 4, respectively. Finally, the logic/calculation engine 50 provides a digital output signal ADC-COUNT which accounts for the errors mentioned above and which, to a higher degree of accuracy, is proportional to the measured photocurrent. In other words, the logic/calculation engine 50 generates a digital output signal ADC-COUNT which can be represented as $$ADC\text{-}COUNT = C1 + CE = C1 + CE(C1, C2),$$

wherein the term CE(C1,C2) indicates that a fractional count CE is a function of both counts C1 and C2.

The digital control circuit 26 not only initializes but also terminates signal acquisition after the integration time has run through. The integration time is set at the digital control circuit 26 depending on the integration time signal STINT.

In an alternative embodiment not shown, the first bias source 18 is omitted. The amplifier reference voltage VREFIN is zero.

FIG. 2 shows an exemplary timing diagram of signals of the exemplary embodiment of an optical sensor arrangement. The drawing shows the different signals and operation of the light-to-frequency converter. Depicted are the first clock signal CLK1 and the second clock signal CLK2. The clock signals are implemented as rectangular functions having a frequency of 737 kHz and 2 MHz, respectively. These values should be considered as examples only and are not restricted to these exact values. Typically the frequency of the first clock signal CLK1 is chosen to be lower than the frequency of the second clock signal CLK2. Furthermore, the drawing shows the output voltage VOUT of the amplifier 15. Finally, FIG. 2 shows the asynchronous count C1 and the time count C2. The signals are represented as functions of time t. As signal acquisition proceeds for a certain integration time TINT the integration time is shown as a means of reference.

The basic operation principle of the optical sensor arrangement is based on the concept of a charge-balancing converter. The converter 12 collects light which is converted into a photocurrent IPD from the photodiode 11 which by several steps is converted into counts. Ideally the number of counts C1 measured during the integration time TINT is a direct measure of the photocurrent IPD. The resulting asynchronous count C1 is complemented with various error estimates which can be derived from the time count C2.

The basic operation principle is implemented by the various components of the optical sensor arrangement. The converter 12 is designed as a charge-balancing converter and is used to convert the photocurrent IPD to a digital count in the form of the digital output signal ADC-COUNT. The photocurrent IPD is integrated into the integration node 32 and the integration capacitor 20 generates the input voltage VNEG. If the charge integrated into the integration capacitor 20 is larger than the unit charge packet QREF the charge on the integration capacitor 20 will be decreased by one unit charge packet and the counter 40 will be incremented by one logical value. The integration time signal STINT determines an integration time TINT. By integrating the photocurrent IPD during the integration time TINT, the asynchronous count C1 will give result in a measure of intensity of light incident on the photodiode 11. The integration time TINT may be 100 ms for example. The integration time TINT is a multiple of a period of the first clock signal CLK1. In this embodiment the comparator reference voltage VREFC is constant and equal to the bias voltage VREF2.

An exemplary measurement cycle may involve the following steps. Initially, when the input control signal ADC_ON is low, the converter 12 is reset. Resetting the converter 12 may involve clearing the photodiode 11; clearing the integration capacitor 20; resetting the input voltage VNEG to the amplifier reference voltage VREFIN; resetting the output voltage VOUT to the first reference voltage VREF1 and thus lower than the comparator reference voltage VREFC. As a consequence the comparator output signal LOUT is low. The reference capacitor 29 is fully charged with the charge package QREF and disconnected from the integration node 32. The first and second counters 41, 42 are cleared so that the digital output signal at the calculation output 51 is 0. The second reference switch signal S2 applied to the reference switch 30 is low.

After the converter is reset, signal acquisition can be initialized by setting the input control signal ADC_ON from low to high. The integration time signal STINT transits from low to high at the same time and the converter 12 starts operation. The photocurrent IPD generated by the photodiode 11 is integrated by an integrator comprising the amplifier 15 and the integrating capacitor 20. The photocurrent IPD is integrated at the integration node 32 and the output voltage VOUT is ramping up during integration. The comparator 22 monitors the output voltage VOUT of the integrator that is the output voltage VOUT of the amplifier 15. When the output voltage VOUT is larger than the comparator reference voltage VREFC, the comparator output signal LOUT is high and a charge packet Qref= $V_{ref,in} \cdot C_{ref}$ is dumped into the integration node 32. The output signal LOUT is received at the first counter and the asynchronous count C1 is incremented by one count.

After the charge dumping the output voltage VOUT is reduced by the value $V_{ref,in} \cdot C_f/C_{int}$. The output voltage VOUT returns back to low, i.e. the level of the first reference voltage VREF1, is lower than the comparator reference voltage VREFC and ramps up back again. The charge packet circuit 29 is disconnected from the integration node 32 and back to a recharging mode. A number N of dumpings is increased by one count. The output voltage VOUT swings between the first reference voltage VREF1 and the bias voltage VREF2. This process is characterized by a charge dumping period CDP and will repeat itself until the integration time TINT is over, the signal STINT transits from high to low. During the integration time TINT, the signal STINT is high, the number counts are accumulated by the first counter 41. The counter value C1 is equal to the number N of dumpings and provides a first measure of the intensity of the incident light. The asynchronous count C1 is equal to the number N of dumpings counted by the first counter 41. The number N of charge dumpings is equal to the counts of the first counter 41 of the converter 12 generated over the period defined by the integration time TINT.

However, the asynchronous count C1 may not be directly proportional to the intensity of the incident light. A number of sources of errors may affect the accuracy of conversion of photocurrent IPD into a digital count in the form of the digital output signal ADC-COUNT. FIG. 2 illustrated two sources from which an error may originate, especially at low count conditions such as low light, for example.

At the end of signal integration the integration time signal STINT transits from high to low. This causes the output voltage VOUT had to interrupt a ramp up to a value less than the comparator reference voltage VREFC. The information incomplete integration is not included into the asynchronous count C1 and, thus, not included into the digital output signal ADC-COUNT if no additional steps are taken. A residual charge QRES remains after integration time is terminated. In other words the last incomplete integration cycle of the converter 12 introduces a measurement error in the asynchronous count C1. As the count value reduces, the magnitude of the error increases more and more. This may prevent getting an accurate measurement from low count values. This error will be referred to as residual count error RCE hereinafter. Another source of error may be due to incorrect initialization of the converter during reset. The integration of the first cycle does not always start from the desired value.

This uncertainty may introduce a measurement error in the asynchronous count C1 as well. Especially if accurate information from low counts is sought it may be beneficial to correct for this effect, hereinafter referred to as first count error FCE. Another source of error referred to as comparator-latch synchronization error CLSE will be discussed in further detail with respect to FIG. 4.

The various errors can be accounted for by generating fractional counts. A fractional count lies between 0 and 1 as it does not qualify for a full count. In fact, full counts are added to the asynchronous count C1. The fractional counts can be determined by using the second counter 42. The second counter 42 receives the second clock signal CLK2 at the second clock input 45. The time count C2 is reset via the second reset input 46 every time a full charge dumping period CDP is completed. The second counter 42 resolves a period between adjacent counts in the asynchronous count C1. In other words every time an integration cycle is completed and a charge is dumped the number N of dumpings is increased by one count in the asynchronous count C1 by the first counter 41. The second counter 42 generates the time count C2 which is a digital value that determines a time period or duration for the respective integration cycle.

The last integration cycle starts at a certain time stamp tR4 which is defined by generating a count in the asynchronous count C1 (see (C1) in the drawing). The integration cycle starts over again by resetting the converter 12 as discussed above. However, in this case the integration terminates before another complete charge dumping period CDP has been completed. This can be characterized by another time stamp tR5. The difference between the two time stamps defines a residual time period C2_L in the time count C2. The residual time period C2_L is determined by the second counter C2 as a function of the second clock signal CLK2. The residual time period C2_L is provided to the calculation input 49 of the logic/calculation engine 50.

Furthermore, the second counter 42 determines one or more complete integration periods C2_P which is defined by consecutive time stamps tR3, tR4 indicating consecutive counts in the asynchronous count C1. The difference between the two consecutive time stamps defines the complete integration periods C2_P in the time count C2. The complete integration periods C2_P is determined by the second counter C2 as a function of the second clock signal CLK2.

Similarly, a start time stamp tR1 can be defined as the moment the first integration is initialized, e.g. by means of the input control signal ADC_ON. The first integration cycle may terminate by charge dumping before a full charge dumping period CDP is completed (see (C2) in the drawing). The moment this first integration cycle is completed can be characterized by another time stamp tR2. The difference between the first two consecutive time stamps tR1, tR2 defines a first integration period C2_F in the time count C2. The first integration period C2_F is determined by the second counter C2 as a function of the second clock signal CLK2.

The first integration period C2_F, the one or more complete integration periods C2_P and the residual time period C2_L are provided to the logic/calculation engine 50. The logic/calculation engine 50 comprises means such as control logic or a microcontroller to hold the time count C2 including the characteristic periods C2_F, C2_P and C2_L and to calculate error estimates from the time count C2.

The residual count error RCE is corrected by calculating a residual signal estimate and adding the result to the asynchronous count C1 of the first counter 41. The residual signal estimate can be approximated as the residual time period C2_L divided by the complete integration period C2_P. Thus, the digital output signal ADC-COUNT can be corrected for the residual count error RCE and yields the value $$ADC-COUNT = C1 + \frac{C2\_L}{C2\_P},$$

wherein C1, C2_L, C2_P are values of the asynchronous count C1, residual time period C2_L and the complete integration period C2_P, respectively. The complete integration period C2_P can be any time period of a complete integration cycle such as the last one, for example. As will be discussed below the complete integration period C2_P can exchanged with an average integration period C2_A to correct for latch-comparator synchronization error.

The first count error FCE can also be accounted for calculating another fractional count based on the first integration period C2_F and the complete integration period C2_P determined by the logic/calculation engine 50. A first count error estimate follows from the fact that integration by means of the converter can be approximated as linear for a given photocurrent IPD. Consequently, a sum of the two incomplete periods C2_L and C2_F can be corrected by one complete integration period C2_P to yield $$ADC-COUNT = C1 + \frac{C2\_F - C2\_P}{C2\_P}.$$

Again the complete integration period C2_P can be any time period of a complete integration cycle such as the last one, for example. As will be discussed below the complete integration period C2_P can exchanged with an average integration period C2_A to correct for latch-comparator synchronization error.

The estimates of the residual count error RCE and the first count error FCE can be used to the digital output signal ADC-COUNT that accounts for both sources of error. Then the digital output signal ADC-COUNT is given by $$ADC-COUNT = C1 + \frac{C2\_L + C2\_F - C2\_P}{C2\_P}.$$

The complete integration period C2_P can be determined as the last complete integration period C2_P before the integration time is run out and the measurement is terminated. However, any complete integration period of complete integration cycles in-between the first integration period C2_F and the residual time period C2_L can be used to determine the last complete integration period C2_P. In an alternative more than one or all complete integration periods can be used to determine an average integration period C2_A. In this case the logic/calculation engine 50 is designed to determine more than one or all complete integration periods and is operable to calculate the average complete integration period C2_P. The average integration period C2_A is then defined as complete integration period C2_P for calculating the error estimates. Thus, $$ADC-\text{COUNT} = C1 + \frac{C2\_L + C2\_F - C2\_A}{C2\_A}.$$

Figure 3:
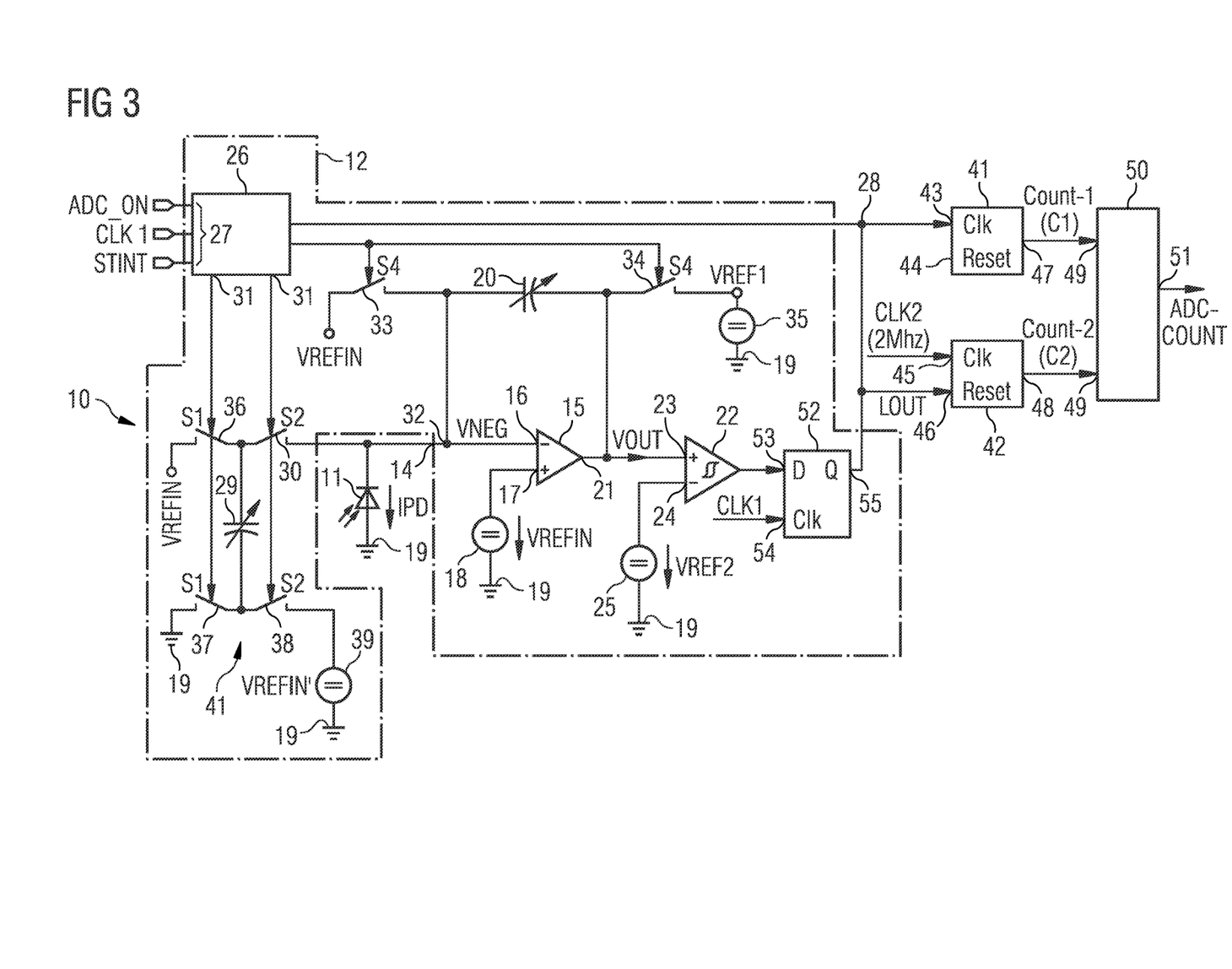
FIG. 3 shows another exemplary embodiment of an optical sensor arrangement.

FIG. 3 shows another exemplary embodiment of an optical sensor arrangement. This embodiment is a further development of the embodiment shown in FIG. 1. The converter 12 further comprises a first and a second discharging switch 33, 34. The first discharging switch 33 couples a first electrode of the integrating capacitor 20 to the first bias source 18. The second discharging switch 34 couples a second electrode of the integrating capacitor 20 to a first reference source 35. The first electrode of the integrating capacitor 20 is connected to the amplifier input 16. The second electrode of the integrating capacitor 20 is connected to the amplifier output 21. Thus, the amplifier reference voltage VREFIN is provided via the first discharging switch 33 to the first electrode of the integrating capacitor 20. Furthermore, a first reference voltage VREF1 is provided by the first reference source 35. The first reference voltage VREF1 is provided via the second discharging switch 34 to the second electrode of the integrating capacitor 20. A discharging control signal S4 provided by the digital control circuit 26 controls the first and the second discharging switch 33, 34. The integrating capacitor 20 is implemented as a variable capacitor. The capacitance value CINT of the integrating capacitor 20 can be set by a capacitor control signal.

The reference capacitor 29 obtains a variable capacitance value CREF. The capacitance value CREF of the reference capacitor 29 is set by a further capacitor control signal. The integrating capacitor 20 and the reference capacitor 29 can be programmed for different ambient light sensor gains, for example.

Moreover, the converter 12 comprises several additional switches which are involved in resetting and charge dumping during the integration process. The reference switch 30 and a first to a third reference switches 36, 37, 38. The first reference switch 36 couples the first bias source 18 to a first electrode of the reference capacitor 29. The reference switch 30 couples the first electrode of the reference capacitor 29 to the amplifier input 16. The second reference switch 37 couples a second electrode of the reference capacitor 29 to the reference potential terminal 19. The third reference switch 38 couples a second reference source 39 to the second electrode of the reference capacitor 29. The second reference source 39 generates a second reference voltage VREFIN'. For charging the reference capacitor 29 the first and the second reference switch 36, 37 are closed and the third reference switch 38 and the reference switch 30 are opened by a first and the second reference switch signal S1, S2. The first and the second reference switch signals S1, S2 are non-overlapping clock signals, for example. For dumping the charge package QREF to the amplifier input 16, the first and the second reference switch 36, 37 are opened and the third reference switch 38 and the reference switch 30 are closed by the first and the second reference switch signal S1, S2.

Furthermore, the comparator 22 is implemented as a latched comparator. Comparator 22 has an output which is connected to a first latch input 53 of a latch 52. The latch 52 comprises a second latch input 54 to receive the first clock signal CLK1. A latch output 55 is connected to the result output 28 of the converter 12 and to the digital control circuit 26.

The comparator 22 and latch 52 are operated as a latched comparator. The latch 52 outputs the comparator output signal LOUT only at certain instances which are defined by the first clock signal CLK1. Due to the first clock signal CLK1 the latched comparator is only comparing the output voltage VOUT of amplifier 15 with the bias voltage VREF2 at certain intervals of the CLK1.

FIG. 4 shows another exemplary timing diagram of signals. The drawing shows the different signals and operation of the light-to-frequency converter of FIG. 3. Depicted are the asynchronous count C1, the digital output signal LOUT, the time count C2 and a modulated time count C2_MOD. The use of the latched comparator may introduce a comparator-latch synchronization error CLSE. The first clock signal CLK1 latches the output of the asynchronous counter 41. A delay in this can be up to one cycle of CLK1. This can cause the converter 12 to continue integrating for up to one cycle in terms of the first clock signal CLK1. This may be another source of error. The comparator-latch synchronization error CLSE manifests itself in a modulation of the time count as depicted in the drawing. The modulated time count C2_MOD illustrates the effect. Basically, the modulation on the time count C2 arises because of the operation of the converter on CLK1 and a frequency of the converter output LOUT that depends on the photocurrent IPD.

The comparator-latch synchronization error CLSE can be accounted for by taking an average of the time count C2 from each period of the asynchronous count C1 to calculate complete integration period C2_P. The average can be taken by different means including an arithmetic mean, a geometric mean, a mode and/or moving average. In this particular embodiment, a number of n complete integration periods C2_P(i), i=1, . . . , n, are determined. All n determined complete integration periods C2_P(n) are summed over the corresponding number of counts, abbreviated as C1(n) and normalized by the number n. This yields $$C2\_A = \frac{\sum_{i=1}^{C1(n)} C2(i)}{n}.$$

The resulting average integration period C2_A can be included into one or more of the equations discussed above. This way the comparator-latch synchronization error CLSE can also be accounted for.

The error corrections discussed above improve the accuracy of light-to-frequency conversion, especially in low count situations. The resulting digital output signal ADC-COUNT can be scaled to a certain amount without scaling the error also.

The invention claimed is:

1. A method for light-to-frequency conversion, comprising the steps of:
    generating a photocurrent by means of a photodiode, wherein the photocurrent is generated during an integration time,
    converting the photocurrent into a digital comparator output signal in a charge balancing operation depending on a first clock signal,
    determining from the digital comparator output signal an asynchronous count comprising an integer number of counts depending on the first clock signal,
    determining from the digital comparator output signal a fractional time count depending on a second clock signal, and calculating from a sum of the asynchronous count and from the fractional time count a digital output signal which is indicative of the photocurrent generated by the photodiode generated during the integration time; and wherein:

the asynchronous count and the fractional time count are determined, in parallel, during the integration time.

2. The method according to claim 1, wherein
the photocurrent is integrated into one or more reference charge packages during an integration time, wherein a detection of a charge package determines an integration cycle,
the first clock signal is used to count a number of reference charge packages during the integration time, and
the asynchronous count is determined from the number of charge packages.

3. The method according to claim 1, wherein a time period of an integration cycle is determined from the fractional time count by measuring a time between adjacent counts in the asynchronous count in terms of the second clock signal.

4. The method according to claim 3, wherein the fractional time count is reset when a time period has been determined.

5. The method according to claim 3, wherein
a time period of a first integration cycle is determined as first integration period, and
the first integration period is determined by a first time stamp indicating a start of the first integration cycle and a second time stamp indicating a time of the first count in the asynchronous count.

6. The method according to claim 3, wherein
the time period of one or more complete integration periods is determined as complete integration period, and
the complete integration period the first integration period is determined by a third time stamps indicating a count in the asynchronous count and a fourth time stamp indicating a time of an adjacent count in the asynchronous count.

7. The method according to claim 6, wherein
more than one complete integration periods are determined, and
an average complete integration periods is determined from the complete integration periods.

8. The method according to claim 3, wherein
a time period after the last complete integration cycle and an end of the integration is determined as residual time period,
the residual integration period is determined by a time stamp indicating a time of the last count in the asynchronous count and a time stamp indicating the end of the integration.

9. The method according to claim 4, wherein
a first count error is accounted for by calculating a first fractional count based on the first integration period and the complete integration period, and
the first fractional count is a measure of the photocurrent generated during the first integration cycle.

10. The method according to claim 4, wherein
a residual count error is accounted for by calculating a second fractional count based on the last integration period and the complete integration period, and
the second fractional count is a measure of the photocurrent generated during the last integration cycle.

11. The method according to claim 4, wherein
the digital comparator output signal is generated by means of a latched comparator,
a comparator-latch synchronization error is accounted for by calculating an average integration period calculated from an average of more than one complete integration periods, and
the average integration period is a measure of a modulation in the digital comparator output signal introduced by the latched comparator.

12. The method according to claim 11, wherein the average integration period is used instead of the complete integration period for calculating the first count error, residual count error, and/or comparator-latch synchronization error.

13. The method according to claim 9, wherein the digital output signal includes a sum based on the asynchronous count and the first and second fractional counts based on one or more complete integration periods and/or the average integration period.

14. A light-to-frequency converter arrangement, comprising:
an analog-to-digital converter arrangement comprising a sensor inputs for connecting a photodiode and a result output for providing a digital comparator output signal, and
a signal processing unit connected to the result output of the analog-to-digital converter arrangement; wherein
the analog-to-digital converter arrangement is operated in a charge balancing operation depending on a first clock signal, and is adapted to convert a photocurrent generated by the photodiode during an integration time into the digital comparator output signal, and
the signal processing unit is adapted to determine from the digital comparator output signal a digital output signal comprising a sum of an asynchronous count comprising an integer number of counts depending on the first clock signal and comprising a fractional time count depending on a second clock signal, wherein the digital output signal is indicative of the photocurrent generated by the photodiode during the integration time; and wherein
the asynchronous count and the fractional time count are determined, in parallel, during the integration time.

15. The light-to-frequency converter arrangement according to claim 14, wherein the signal processing unit comprises
a first counter having a first clock input connected to the result output and comprising a first reset input,
a second counter comprising a second clock input and a second reset input,
a logic/calculation engine comprising a calculation input connected to a first counter output of the first counter and a second counter output of the second counter; wherein
the first counter receives the first clock signal at the first clock input and generates the asynchronous count depending on the first clock signal,
the second counter receives the second clock signal at the second clock input and generates the fractional time count depending on the second clock signal,
the logic/calculation engine receives the asynchronous count and the time count and calculates the digital output signal from the asynchronous count and the time count.

16. The light-to-frequency converter arrangement according to claim 14, wherein the analog-to-digital converter arrangement comprises a latched comparator providing the digital comparator output signal, and the signal processing unit is adapted to determine from the fractional time count an average integration period being a measure of a modulation in the digital comparator output signal introduced by the latched comparator.

17. A method for light-to-frequency conversion, comprising the steps of:

generating a photocurrent by means of a photodiode, converting the photocurrent into a digital comparator output signal in a charge balancing operation depending on a first clock signal, determining from the digital comparator output signal an asynchronous count comprising an integer number of counts depending on the first clock signal, determining from the digital comparator output signal a fractional time count depending on a second clock signal, calculating from the asynchronous count and from the fractional time count a digital output signal which is indicative of the photocurrent generated by the photodiode, and determining a time period of an integration cycle from the fractional time count by measuring a time between adjacent counts in the asynchronous count in terms of the second clock signal.

* * * * *